US012287554B2

(12) United States Patent
Bian et al.

(10) Patent No.: US 12,287,554 B2
(45) Date of Patent: Apr. 29, 2025

(54) ARRAY SUBSTRATE, PREPARATION METHOD THEREOF, DISPLAY PANEL AND DISPLAY APPARATUS

(71) Applicants: Beijing BOE Optoelectronics Technology Co., Ltd., Beijing (CN); BOE TECHNOLOGY GROUP CO., LTD., Beijing (CN)

(72) Inventors: Ruomei Bian, Beijing (CN); Jian Wang, Beijing (CN); Yong Zhang, Beijing (CN); Xianglei Qin, Beijing (CN); Xing Xu, Beijing (CN); Jiaxing Wang, Beijing (CN); Xuan Zhong, Beijing (CN); Honggui Jin, Beijing (CN); Liangzhen Tang, Beijing (CN); Zhaohu Yu, Beijing (CN); Wulin Zhang, Beijing (CN); Yongzhong Zhang, Beijing (CN)

(73) Assignees: Beijing BOE Optoelectronics Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/290,764

(22) PCT Filed: Aug. 1, 2022

(86) PCT No.: PCT/CN2022/109338
§ 371 (c)(1),
(2) Date: Jan. 20, 2024

(87) PCT Pub. No.: WO2023/011389
PCT Pub. Date: Feb. 9, 2023

(65) Prior Publication Data
US 2024/0377685 A1 Nov. 14, 2024

(30) Foreign Application Priority Data
Aug. 6, 2021 (CN) .......................... 202110902258.0

(51) Int. Cl.
*G02F 1/1362* (2006.01)
*G02F 1/1333* (2006.01)
(Continued)

(52) U.S. Cl.
CPC .. *G02F 1/136286* (2013.01); *G02F 1/133357* (2021.01); *G02F 1/13394* (2013.01);
(Continued)

(58) Field of Classification Search
CPC ......... G02F 1/136286; G02F 1/133357; G02F 1/13394; G02F 1/13439; G02F 1/136209; G02F 1/1368; H01L 27/124
See application file for complete search history.

(56) References Cited

U.S. PATENT DOCUMENTS

2009/0310070 A1\* 12/2009 Ishii .................. G02F 1/133555
349/114
2019/0229217 A1 7/2019 Kimura et al.
2020/0381667 A1 12/2020 Lee et al.

FOREIGN PATENT DOCUMENTS

CN 1914547 A 2/2007
CN 101460890 A 6/2009
(Continued)

OTHER PUBLICATIONS

China Patent Office, First Office Action issued Jul. 22, 2023 for application No. CN202110902258.0.

*Primary Examiner* — James A Dudek
(74) *Attorney, Agent, or Firm* — HOUTTEMAN LAW LLC

(57) ABSTRACT

An array substrate, including a first substrate, and a plurality of gate lines and a plurality of data lines defining a plurality
(Continued)

of subpixel regions each including a reflective region and a transmissive region, wherein the reflective region includes a reflective electrode, and the transmissive region includes a transmissive electrode; a first spacing region including a preset subregion is between two adjacent reflective electrodes in a first direction; the data line includes a first portion in the preset subregion, and a width of the first portion in the first direction is smaller than that of the preset subregion; and the array substrate further includes a first light shielding pattern opposite to the first portion and in the same layer as the gate lines, where an orthographic projection of the first light shielding pattern on the first substrate completely covers an orthographic projection of the preset subregion on the first substrate.

17 Claims, 13 Drawing Sheets

(51) Int. Cl.
*G02F 1/1339* (2006.01)
*G02F 1/1343* (2006.01)
*G02F 1/1368* (2006.01)
*H01L 27/12* (2006.01)

(52) U.S. Cl.
CPC .... *G02F 1/13439* (2013.01); *G02F 1/136209* (2013.01); *G02F 1/1368* (2013.01); *H01L 27/124* (2013.01)

(56) References Cited

FOREIGN PATENT DOCUMENTS

| | | |
|---|---|---|
| CN | 102749773 A | 10/2012 |
| CN | 103676333 A | 3/2014 |
| CN | 105446039 A | 3/2016 |
| CN | 206258658 U | 6/2017 |
| CN | 109116647 A | 1/2019 |
| CN | 110148631 A | 8/2019 |
| CN | 110690226 A | 1/2020 |
| CN | 110718571 A | 1/2020 |
| CN | 111627973 A | 9/2020 |
| CN | 111916470 A | 11/2020 |
| JP | 2005091819 A | 4/2005 |

\* cited by examiner

ARRAY SUBSTRATE, PREPARATION METHOD THEREOF, DISPLAY PANEL AND DISPLAY APPARATUS

TECHNICAL FIELD

The present disclosure relates to the field of display, and particularly relates to an array substrate, a preparation method thereof, a display panel, and a display apparatus.

BACKGROUND

In recent years, the display technology has a diversified trend, the liquid crystal display (LCD) industry faces great challenges, and various manufacturers are seeking different possibilities in various directions. Integrating the characteristics of both a transmissive display screen and a reflective display screen, the transflective display apparatus implements display by reflecting light with a reflective electrode in a strong light environment, and by backlight in a weak light environment. In other words, the backlight brightness can be adjusted according to the light intensity. Therefore, the transflective display apparatus is more energy-saving and environment-friendly while achieving a more excellent display effect, and thus is widely applied in recent years.

SUMMARY

In a first aspect, an embodiment of the present disclosure provides an array substrate, including a first substrate, a plurality of gate lines, and a plurality of data lines, wherein each of the plurality of gate lines extends in a first direction, each of the plurality of data lines extends in a second direction, and the plurality of gate lines and the plurality of data lines define a plurality of subpixel regions each including a reflective region and a transmissive region, the reflective region is provided with a reflective electrode, the transmissive region is provided with a transmissive electrode, and the reflective electrode is electrically connected to the transmissive electrode;

a first spacing region is between any two adjacent reflective electrodes in the first direction, wherein the first spacing region extends in the second direction and includes a preset subregion having opposite edges in the first direction respectively coinciding with corresponding edges of two reflective electrodes adjacent to the preset subregion;

the data line includes a first portion in the preset subregion, and a width of the first portion in the first direction is smaller than a width of the preset subregion in the first direction; and the array substrate further includes a first light shielding pattern opposite to the first portion and in the same layer as the gate lines, wherein an orthographic projection of the first light shielding pattern on the first substrate completely covers an orthographic projection of the preset subregion on the first substrate.

In some embodiments, the first spacing region further includes a further subregion other than the first subregion, and the data line further includes a further portion other than the first portion; and an overall orthographic projection of the first light shielding pattern and the data line on the first substrate completely covers an orthographic projection of the first spacing region on the first substrate.

In some embodiments, the further portion includes a second portion intersected with a corresponding one of the plurality of gate lines, a third portion connected between a first end of the second portion and a second end of the first portion, and a fourth portion connected between a second end of the second portion and a first end of the first portion; and the first portion has a width w1 in the first direction, and the third portion has a width w3 in the first direction; where w3>w1.

In some embodiments, the further subregion includes a second subregion arranged along the second direction with the preset subregion, and an orthographic projection of the third portion on the first substrate completely covers an orthographic projection of the second subregion on the first substrate.

In some embodiments, the second portion has a width w2 in the first direction;
where w2<w3.

In some embodiments, the fourth portion has a minimum width w4 in the first direction;
where w4>w1.

In some embodiments, an end of the fourth portion connected to the second end of the second portion is a first end of the fourth portion, and an end of the fourth portion connected to the first end of the first portion is a second end of the fourth portion; and in a direction from the first end of the fourth portion to the second end of the fourth portion, the fourth portion has a width in the first direction monotonically decreasing.

In some embodiments, the array substrate further includes a plurality of common voltage lines in the same layer as the gate lines, extending in the first direction, and insulated from the first light shielding pattern; wherein for any subpixel region, a gate line corresponding to the subpixel region is on a second side of a common voltage line corresponding to the subpixel region;

the first spacing region is divided into a first subregion and a second subregion by the corresponding common voltage line, the first subregion is on a first side of the corresponding common voltage line, the second subregion is on a second side of the corresponding common voltage line, and the first side and the second side are opposite sides in the second direction; and the preset subregion is in the first subregion, an end of the first portion away from the second subregion is the first end of the first portion, and an end of the first portion close to the second subregion is the second end of the first portion.

In some embodiments, the reflective region is further provided with a transistor and a storage capacitor, a gate of the transistor is electrically connected to a corresponding one of the plurality of gate lines, a first electrode of the transistor is electrically connected to the reflective electrode, and a second electrode of the transistor is electrically connected to a corresponding one of the plurality of data lines;

the storage capacitor includes a first conductive plate and a second conductive plate opposite to each other, the first conductive plate is in the same layer as the gate lines and connected to a corresponding one of the plurality of common voltage lines, while the second conductive plate is in the same layer as the data lines and connected to the first electrode of the transistor; and the reflective electrode is on a side of the second conductive plate away from the first substrate, and connected to the second conductive plate through a via.

In some embodiments, a planarization layer formed with a first via is provided on a side of the second conductive plate away from the first substrate, and a passivation layer is provided on a side of the planarization layer away from the first substrate and formed with a second via in a region where the first via is located;

the reflective electrode is on a side of the passivation layer away from the first substrate, and connected to the second conductive plate through the second via; and a length of the first via in the first direction is smaller than a length of the first via in the second direction.

In some embodiments, the first via has a length L1 in the first direction, and the first via has a length L2 in the second direction;

where $5.5 \ \mu m \leq L1 \leq 6.5 \ \mu m$; and $9 \ \mu m \leq L2 \leq 11 \ \mu m$.

In some embodiments, a length of the second via in the first direction is smaller than a length of the first via in the first direction; and a length of the second via in the second direction is the same as the length of the second via in the first direction.

In some embodiments, the first via has a length L1 in the first direction, the first via has a length L2 in the second direction, the second via has a length L3 in the first direction, and the second via has a length L4 in the second direction;

where $5.5 \ \mu m \leq L1 \leq 6.5 \ \mu m$;

$9 \ \mu m \leq L2 \leq 11 \ \mu m$;

$4 \ \mu m \leq L3 \leq 5 \ \mu m$; and $4 \ \mu m \leq L4 \leq 5 \ \mu m$.

In some embodiments, the first conductive plate includes a first conductive pattern on a first side of the corresponding common voltage line, and the second conductive plate includes a second conductive pattern on the first side of the corresponding common voltage line;

two adjacent first conductive patterns in the first direction have a gap s1 therebetween in the first direction, two adjacent second conductive patterns in the first direction have a gap s2 therebetween in the first direction, the first spacing region has a width s0 in the first direction, and the first light shielding pattern has a width w0 in the first direction;

where $s0 \leq w0 < s1$, $s0 \leq w1 < s2$, and $s1 > s2$.

In some embodiments, the first spacing region has a width s0 in the first direction, the first light shielding pattern has a width w0 in the first direction, and the first portion has a width w1 in the first direction;

where $6 \ \mu m \leq s0 \leq 7 \ \mu m$;

$9 \ \mu m \leq w0 \leq 12 \ \mu m$; and $2 \ \mu m \leq w1 \leq 4 \ \mu m$.

In some embodiments, the first spacing region has a width s0 in the first direction, the first light shielding pattern has a width w0 in the first direction, the second portion has a width w2 in the first direction, and the fourth portion has a minimum width w4 in the first direction;

where $6 \ \mu m \leq s0 \leq 7 \ \mu m$;

$9 \ \mu m \leq w0 \leq 12 \ \mu m$;

$2 \ \mu m \leq w1 \leq 4 \ \mu m$;

$2 \ \mu m \leq w2 \leq 4 \ \mu m$;

$9 \ \mu m \leq w3 \leq 12 \ \mu m$; and $9 \ \mu m \leq w4 \leq 12 \ \mu m$.

In some embodiments, a second spacing region is formed between two adjacent reflective electrodes in the second direction, and extends in the second direction;

the gate line includes a fifth portion and a sixth portion alternately arranged, the fifth portion is intersected with a corresponding one of the plurality of data lines, and the sixth portion is connected to an adjacent fifth portion; and an orthographic projection of the sixth portion on the first substrate completely covers an orthographic projection of the second spacing region on the first substrate.

In some embodiments, the fifth portion has a width w5 in the second direction, and the sixth portion has a width w6 in the second direction;

where $w5 < w6$.

In some embodiments, the second spacing region has a width s3 in the second direction, the fifth portion has a width w5 in the second direction, and the sixth portion has a width w6 in the second direction;

where $6 \ \mu m \leq s3 \leq 7 \ \mu m$;

$4 \ \mu m \leq w5 \leq 6 \ \mu m$; and $9 \ \mu m \leq w6 \leq 12 \ \mu m$.

In some embodiments, the reflective region is further provided with a transistor, wherein a gate of the transistor is connected to a corresponding one of the plurality of gate lines, a first electrode of the transistor is connected to the reflective electrode, and a second electrode of the transistor is connected to a corresponding one of the plurality of data lines;

a planarization layer formed with a transmissive is provided on a side of the transistor away from the first substrate, and a passivation layer is provided on a side of the planarization layer away from the first substrate; and the reflective electrode is on a side of the passivation layer away from the first substrate, and formed with a third via in a region where the transmissive is located, the transmissive electrode is on a side of the reflective electrode away from the first substrate and completely covers the third via, and a region where the third via is the transmissive region.

In a second aspect, an embodiment of the present disclosure further provides a display panel, including the array substrate according to the first aspect.

In some embodiments, the display panel further includes an opposite substrate opposite to the array substrate, and a liquid crystal layer between the array substrate and the opposite substrate.

In some embodiments, a plurality of spacers are provided between the array substrate and the opposite substrate;

the opposite substrate includes a second substrate, and second light shielding patterns on a side of the second substrate close to the array substrate; and an orthographic projection of each of the second light shielding pattern on the second substrate completely covers an orthographic projection of one of the spacers on the second substrate, but is not overlapped with the orthographic projection of the first spacing region on the second substrate.

In some embodiments, the orthographic projection of the second light shielding pattern on the second substrate is not overlapped with the orthographic projection of the second spacing region on the second substrate.

In some embodiments, a spacer placement region is provided at each one of intersections of the plurality of gate lines and the plurality of data lines, and the spacers and the second light shielding patterns are each in the spacer placement region.

In some embodiments, the second light shielding pattern has a regular octagonal shape.

In a third aspect, an embodiment of the present disclosure further provides a display apparatus, including the display panel according to the second aspect.

In a fourth aspect, an embodiment of the present disclosure further provides a method for preparing an array substrate, wherein the array substrate is the array substrate according to the first aspect, and the method includes:

forming a plurality of gate lines, a plurality of data lines, and a plurality of first light shielding patterns on a side of a first substrate, wherein each of the plurality of gate lines extends in a first direction, each of the plurality of data lines extends in a second direction, and the plurality of gate lines and the plurality of data lines define a plurality of subpixel regions each including a reflective region and a transmissive region, the data line includes a first portion, the plurality of light shielding patterns are in the same layer as the plurality of gate lines and each opposite to the first portion;

forming a reflective electrode in the reflective region and a transmissive electrode in the transmissive region, wherein the reflective electrode is electrically connected to the transmissive electrode, a first spacing region is formed between two adjacent reflective electrodes in the first direction, and the first spacing region extends in the second direction and includes a preset subregion having opposite edges in the first direction respectively coinciding with corresponding edges of the two reflective electrodes adjacent to the preset subregion;

wherein the first portion is in the preset subregion, and a width of the first portion in the first direction is smaller than a width of the preset subregion in the first direction, and an orthographic projection of the first light shielding pattern on the first substrate completely covers an orthographic projection of the preset subregion on the first substrate.

In some embodiments, the first light shielding patterns and the gate lines are formed based on a patterning process of the same material film.

In some embodiments, forming the reflective electrode includes:

forming a reflective metal material film;

coating a photoresist on a side of the reflective metal material film away from the substrate, exposing the photoresist through a preset mask, developing the exposed photoresist, reserving a portion of the photoresist in a region where a reflective electrode is to be formed, and removing other portions of the photoresist beyond the region where the reflective electrode is to be formed, to form an exposed region;

performing first wet etching on a reflective metal material in the exposed region;

performing dry etching on organic residues in the exposed region; and performing second wet etching on the residual reflective metal material in the exposed region.

In some embodiments, the array substrate is the array substrate described above, after forming the data lines and before forming the reflective electrode, the method further includes:

sequentially forming a planarization layer and a passivation layer, wherein a transmissive is formed in the planarization layer; and performing, in the process of preparing the reflective electrode, alignment with reference to an actual position of the prepared planarization layer.

DETAIL DESCRIPTION OF EMBODIMENTS

Figure 1:
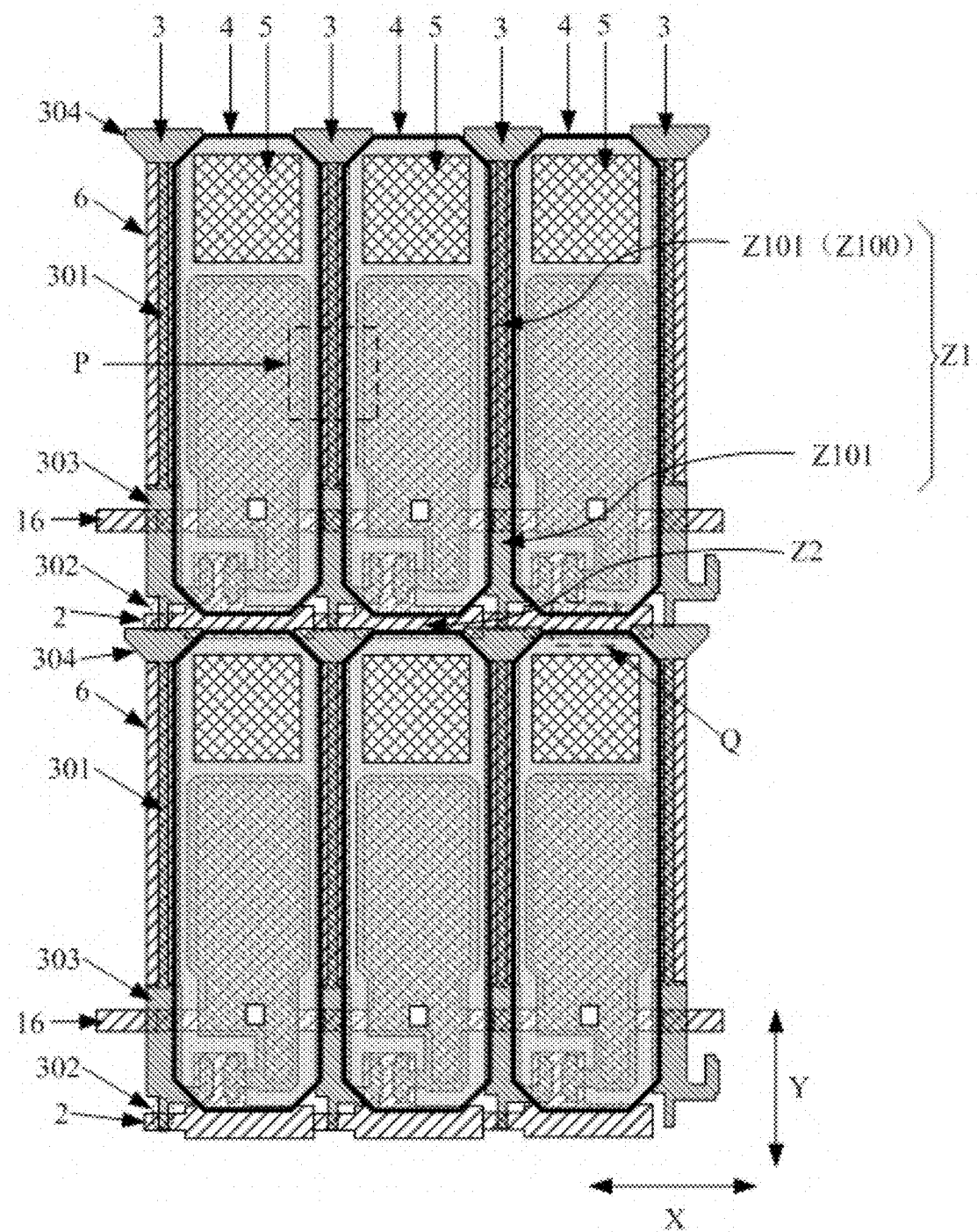
FIG. 1 is a schematic top view of a part of an array substrate according to an embodiment of the present disclosure.

To make the objects, technical solutions and advantages of the embodiments of the present disclosure more apparent, the technical solutions according to the embodiments of the present disclosure will be clearly and completely described below with reference to the drawings of the embodiments of the present disclosure. Apparently, the described embodiments are some, but not all, of the embodiments of the present disclosure. Further, the embodiments of the present disclosure and features thereof may be combined with each other as long as they are not contradictory. All other embodiments obtained by those of ordinary skill in the art based on the embodiments of the present disclosure described herein without paying any creative effort shall be included in the protection scope of the present disclosure.

Unless otherwise defined, technical or scientific terms used in the present disclosure are intended to have general meanings as understood by those of ordinary skill in the art. The words "first", "second" and similar terms used in the present disclosure do not denote any order, quantity, or importance, but are used merely for distinguishing different components from each other. The word "comprising" or "including" or the like means that the element or item preceding the word contains elements or items that appear after the word or equivalents thereof, but does not exclude other elements or items. The terms "connected" or "coupled" and the like are not restricted to physical or mechanical connections, but may include electrical connections, whether direct or indirect.

In the existing art, the transflective liquid crystal display panel is formed by aligning and assembling an array substrate and an opposite substrate, and a reflective electrode (in a reflective region) and a transmissive electrode (in a transmissive region) are correspondingly provided in each subpixel region in the array substrate. Due to the influence of the preparation process, an alignment deviation, or other factors, a certain spacing region is desired between adjacent reflective electrodes, and has a width generally greater than or equal to 6.5 µm. To avoid light transmission at the spacing region, a black matrix is disposed at a position opposite to the spacing region on the opposite substrate to shield the spacing region.

In the process of aligning and assembling the array substrate and the opposite substrate, there may be a certain alignment deviation (generally about 4.5 µm) between the black matrix and the spacing region. To ensure that the spacing region can still be effectively shielded by the black matrix after the alignment and assembly with an alignment deviation, the influence of the alignment deviation will be considered in predesign of a line width of the black matrix to design a black matrix with a larger line width. However, a too large line width of the black matrix will inevitably cause invasion into the pixel region, resulting in a relatively low aperture ratio of the pixel region.

To effectively solve at least one of the technical problems in the existing art, the embodiments of the present disclosure provide corresponding solutions, and the array substrate, the preparation method thereof, the display panel, and the display apparatus provided in the embodiments of the present disclosure will be described in detail below with reference to specific embodiments.

Figure 2:
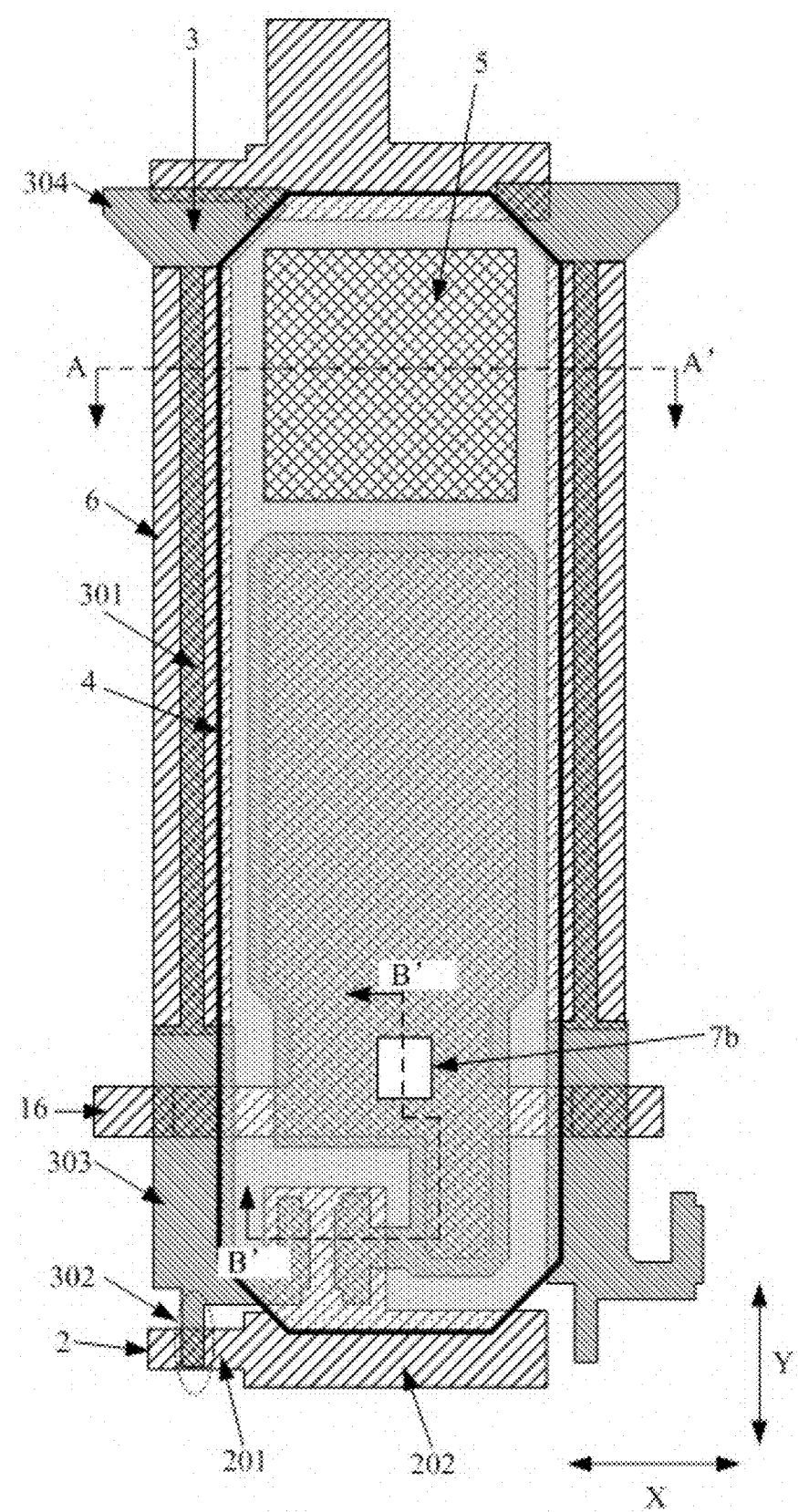
FIG. 2 is a schematic top view of a pixel region according to an embodiment of the present disclosure.
Figure 3:
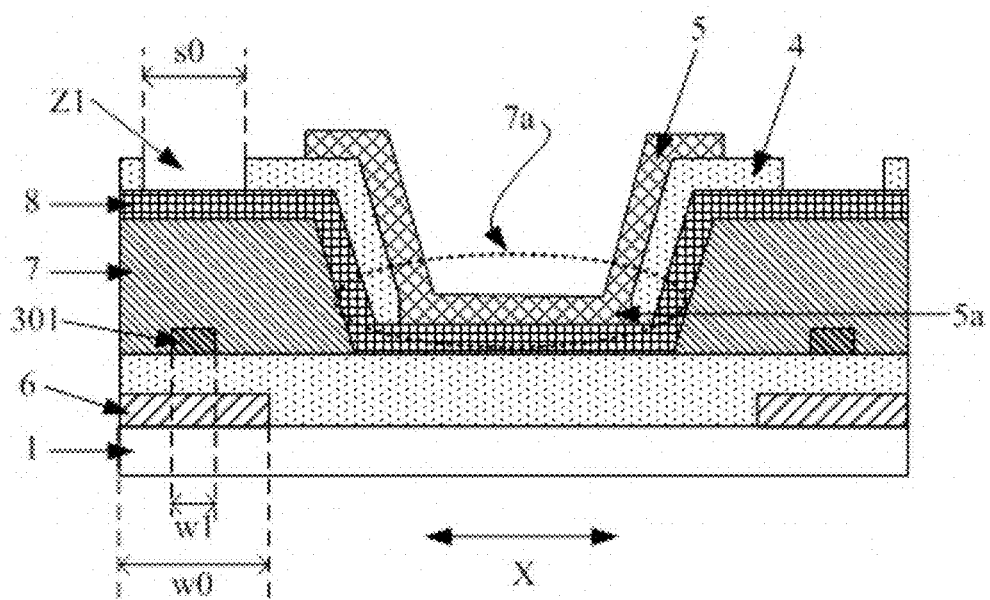
FIG. 3 is a schematic sectional view taken along line A-A' in FIG. 2.
Figure 4:
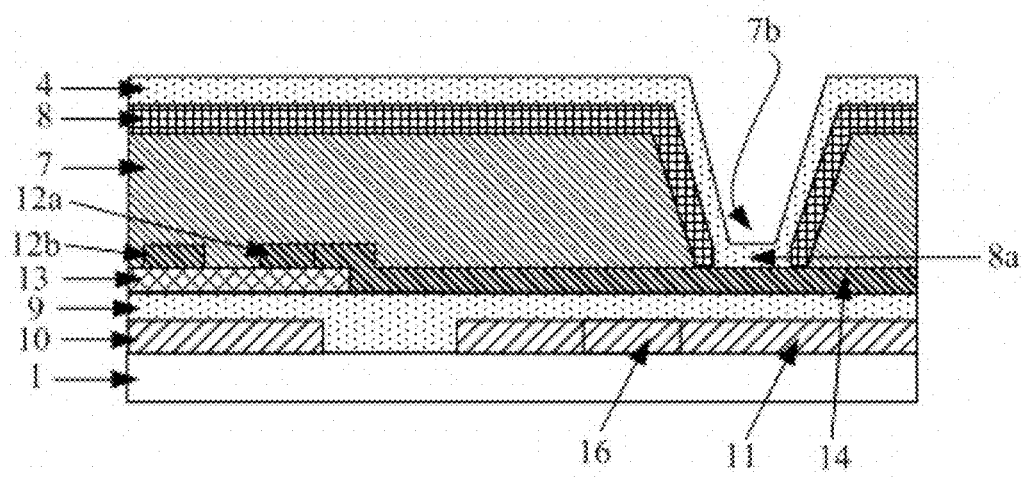
FIG. 4 is a schematic sectional view of region B-B' according to an embodiment of the present disclosure.
Figure 5:
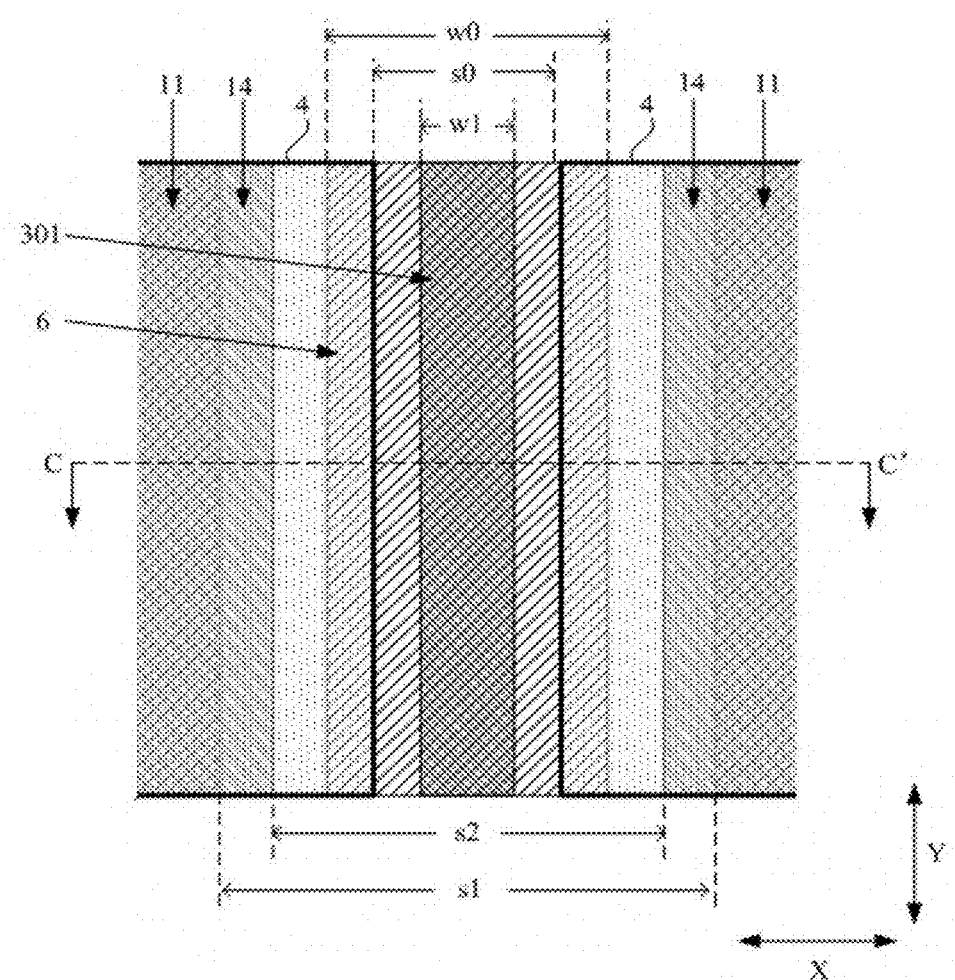
FIG. 5 is a partial enlarged view of region P according to an embodiment of the present disclosure.
Figure 6:
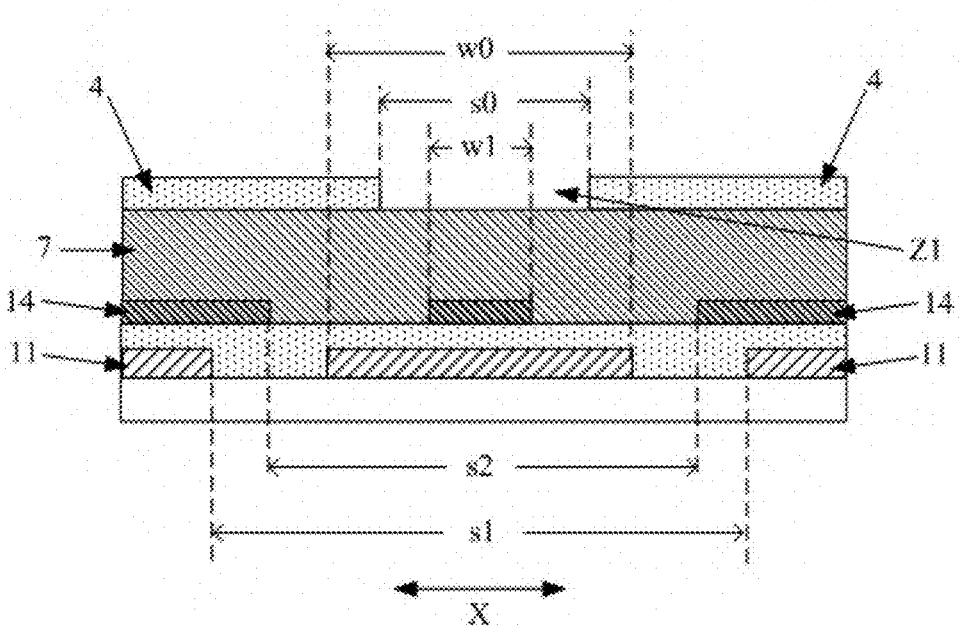
FIG. 6 is a schematic sectional view taken along line C-C' in FIG. 5.
Figure 7:
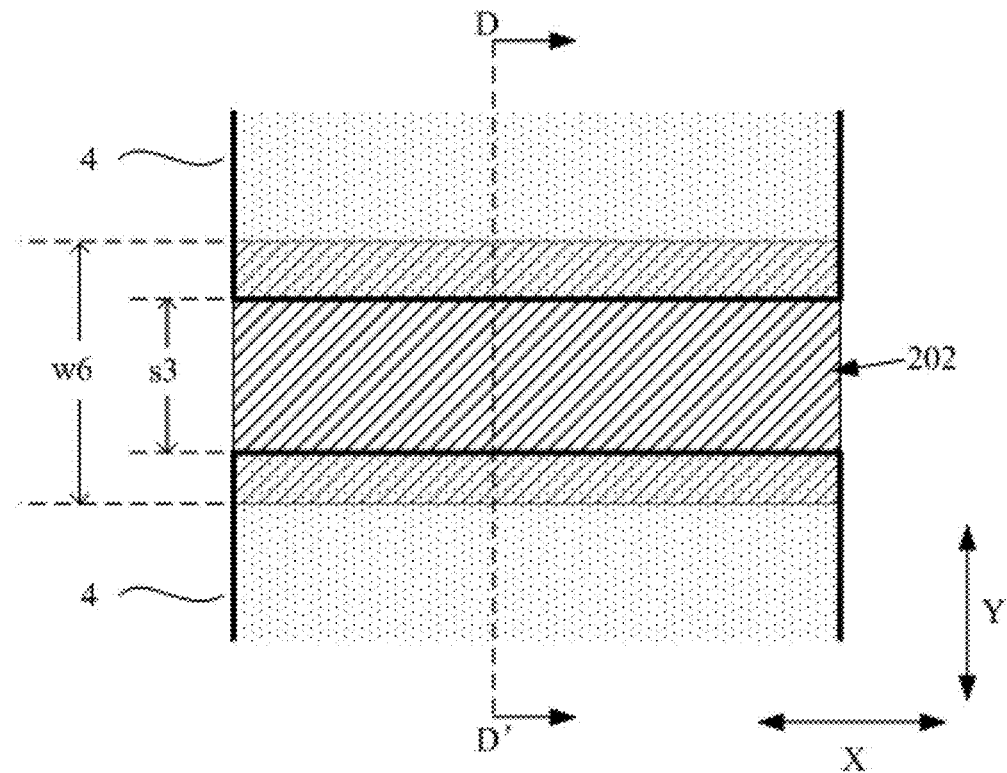
FIG. 7 is a partial enlarged view of region Q according to an embodiment of the present disclosure.
Figure 8:
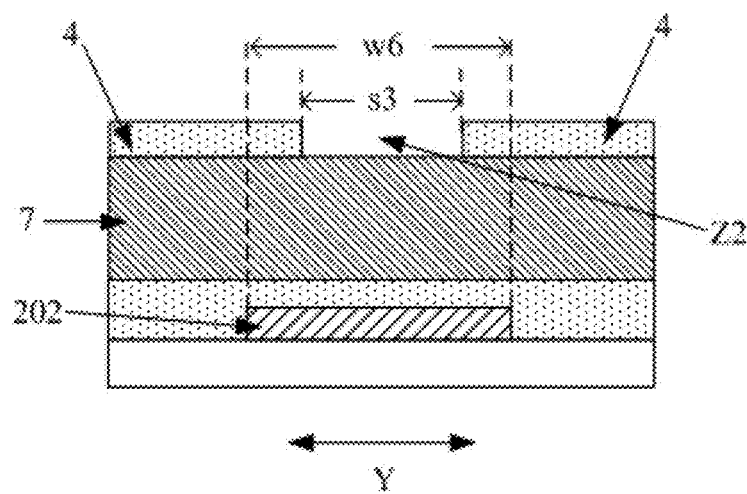
FIG. 8 is a schematic sectional view taken along line D-D' according to an embodiment of the present disclosure.
Figure 9:
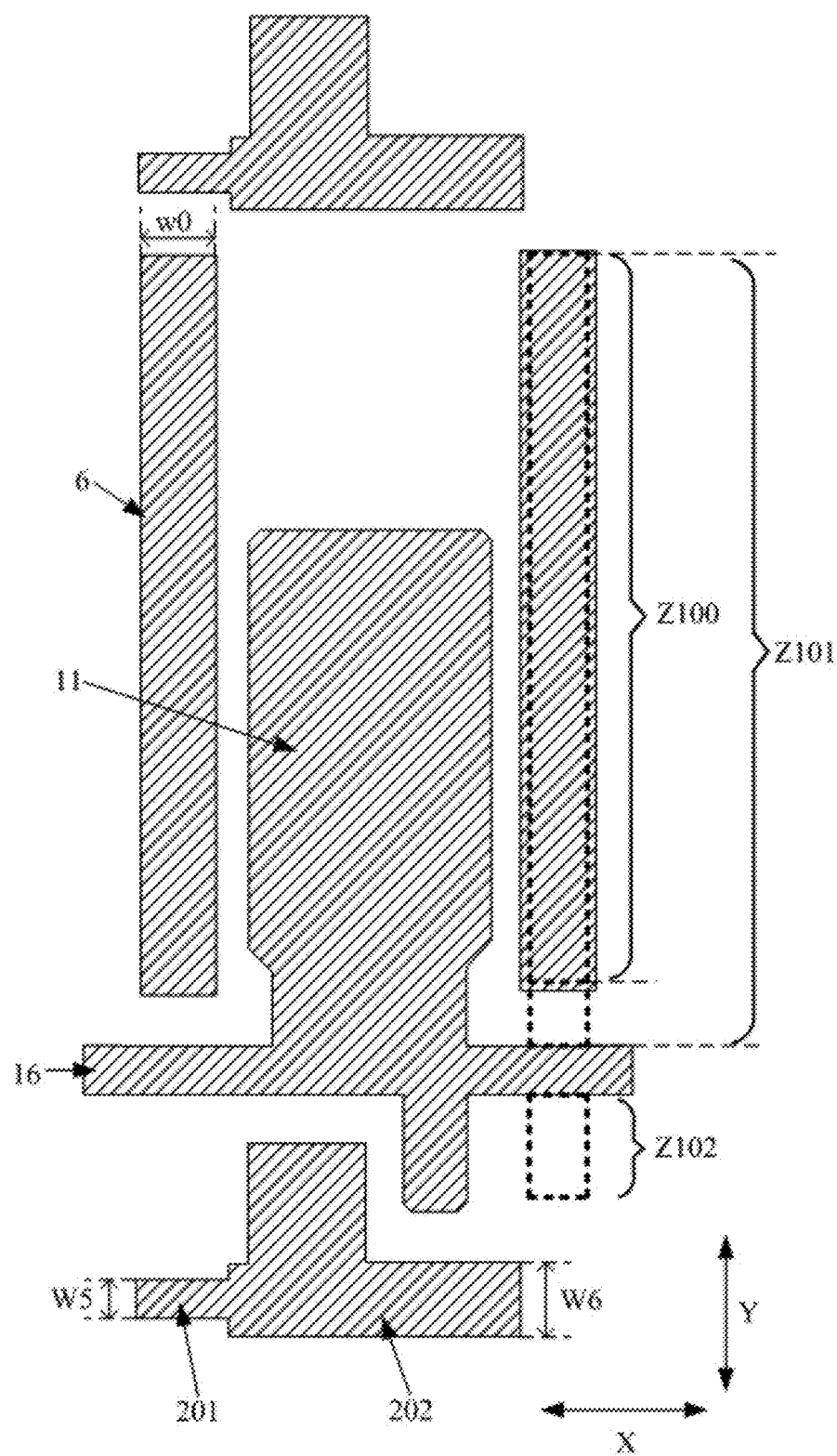
FIG. 9 is a schematic top view of a structural layer where gate lines are located according to an embodiment of the present disclosure.
Figure 10:
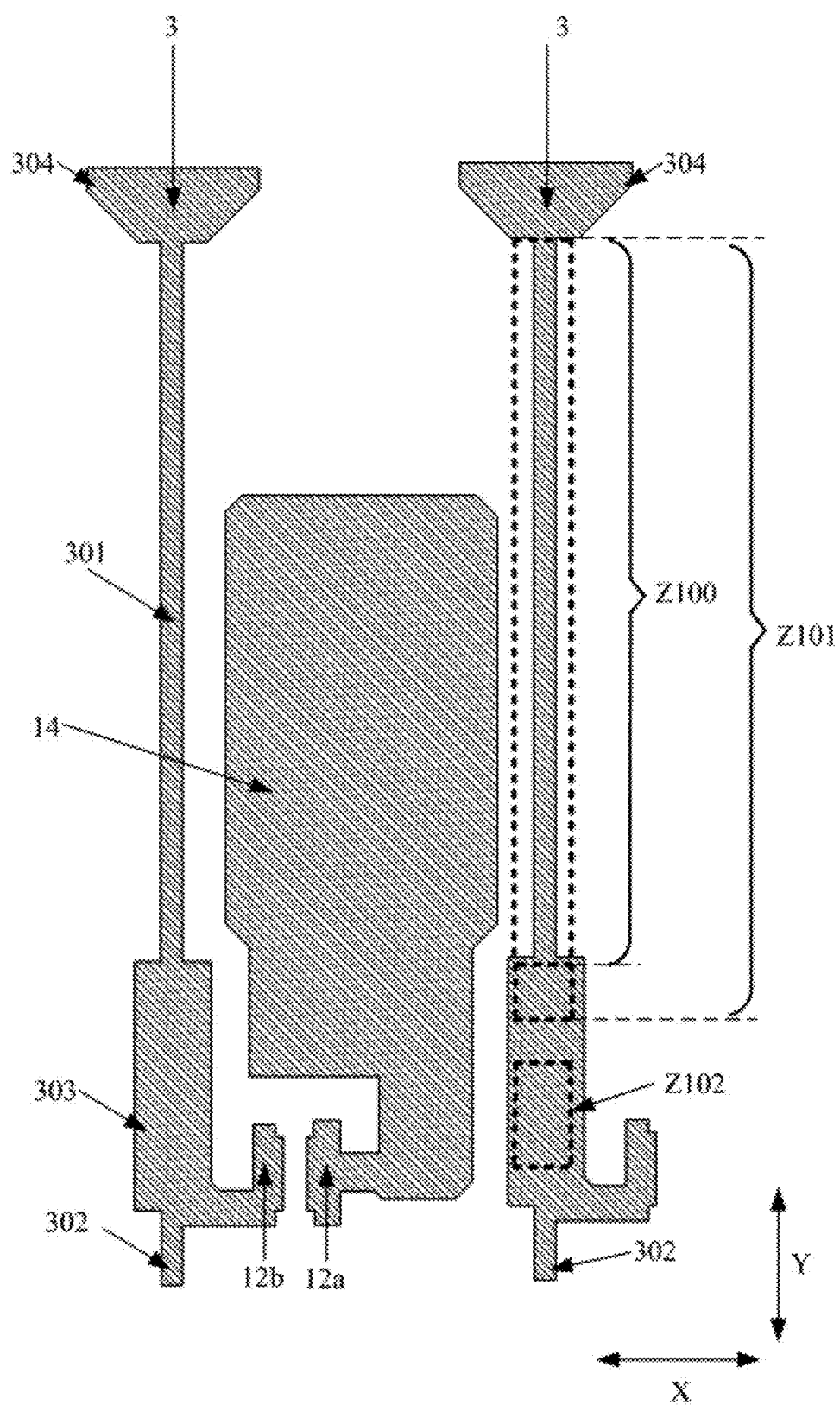
FIG. 10 is a schematic top view of a structural layer where data lines are located according to an embodiment of the present disclosure.
Figure 11:
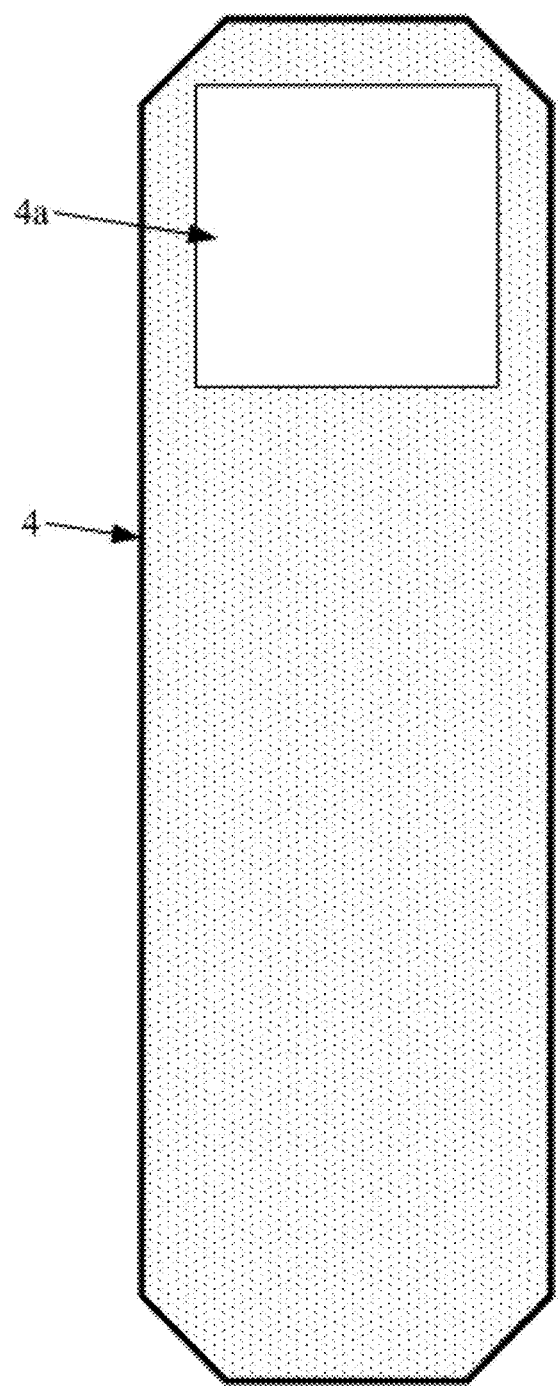
FIG. 11 is a schematic top view of a structural layer where a reflective electrode is located according to an embodiment of the present disclosure.
Figure 12:
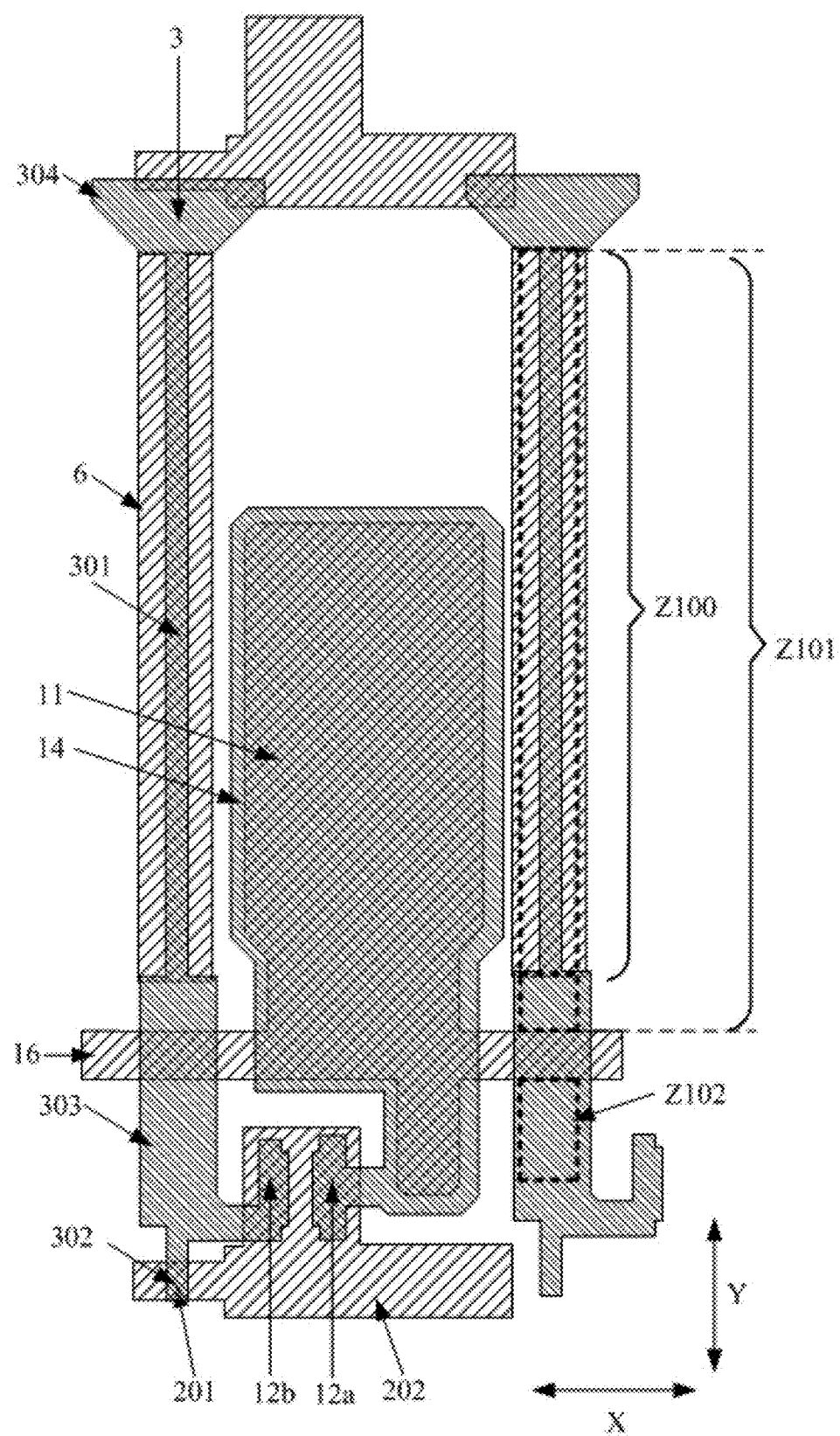
FIG. 12 is a schematic top view of the structural layer where the gate lines are located and the structural layer where the data lines are located arranged in a stack according to an embodiment of the present disclosure.

FIG. 1 is a schematic top view of a part of an array substrate according to an embodiment of the present disclosure, FIG. 2 is a schematic top view of a pixel region according to an embodiment of the present disclosure, FIG. 3 is a schematic sectional view taken along line A-A' in FIG. 2, FIG. 4 is a schematic sectional view of region B-B' according to an embodiment of the present disclosure, FIG. 5 is a partial enlarged view of region P according to an embodiment of the present disclosure, FIG. 6 is a schematic sectional view taken along line C-C' in FIG. 5, FIG. 7 is a partial enlarged view of region Q according to an embodiment of the present disclosure, FIG. 8 is a schematic sectional view taken along line D-D' according to an embodiment of the present disclosure, FIG. 9 is a schematic top view of a structural layer where gate lines are located according to an embodiment of the present disclosure, FIG. 10 is a schematic top view of a structural layer where data lines are located according to an embodiment of the present disclosure, FIG. 11 is a schematic top view of a structural layer where a reflective electrode is located according to an embodiment of the present disclosure, and FIG. 12 is a schematic top view of the structural layer where the gate lines are located and the structural layer where the data lines are located arranged in a stack according to an embodiment of the present disclosure. As shown in FIGS. 1 to 12, the array substrate of the present disclosure includes a first substrate 1, a plurality of gate lines 2, and a plurality of data lines 3. The gate lines 2 extend in a first direction X, the data lines 3 extend in a second direction Y, and the plurality of gate lines 2 and the plurality of data lines 3 define a plurality of subpixel regions each including a reflective region and a transmissive region. The reflective region is provided with a reflective electrode 4, the transmissive region is provided with a transmissive electrode 5, and the reflective electrode 4 is electrically connected to the transmissive electrode 5.

A first spacing region Z1 is formed between two adjacent reflective electrodes 4 in the first direction X (accordingly, edges of the first spacing region Z1 coincide with corresponding edges of the reflective electrodes 4). The first spacing region Z1 extends in the second direction Y and includes a preset subregion Z100 having opposite edges in the first direction X respectively coinciding with corresponding edges of two reflective electrodes 4 adjacent to the preset subregion Z100.

Each data line 3 includes a first portion 301 in the preset subregion Z100, and a width of the first portion 301 in the first direction X is smaller than a width of the preset subregion Z100 in the first direction X. In other words, a length of the preset subregion Z100 in the second direction Y is greater than or equal to a length of the first portion 301 in the second direction.

The array substrate further includes a first light shielding pattern 6 opposite to the first portion 301 and disposed in the same layer as the gate lines 2. An orthographic projection of the first light shielding pattern on the first substrate completely covers an orthographic projection of the preset subregion Z100 on the first substrate 1. In other words, a width of the first light shielding pattern 6 in the first direction X is greater than the width of the first portion 301 in the first direction X, and a length of the first light shielding pattern 6 in the second direction Y is greater than or equal to the length of the first portion 301 in the second direction Y.

In the embodiments of the present disclosure, exemplary description is given by taking the first direction X being a row direction in FIG. 1 and the second direction Y being a column direction in FIG. 1 as an example.

In the embodiments of the present disclosure, by providing the first light shielding pattern 6 in the array substrate, the first light shielding pattern can shield the preset subregion Z100 in the first spacing region Z1 formed between two adjacent reflective electrodes 4 in the first direction X, and in this case, a black matrix pattern for light shielding on the opposite substrate at a position opposite to the preset subregion Z100 is omitted, thereby effectively improving the problem in the existing art with a relatively low aperture ratio of the pixel region due to provision of a black matrix pattern having a relatively large line width at a position on the opposite substrate opposite to the preset subregion Z100. Meanwhile, compared to the existing art, the black matrix pattern for light shielding provided on the opposite substrate in the present disclosure has a reduced area (at least no black matrix pattern is at a position opposite to the preset subregion Z100), and thus, the opposite substrate and the array substrate have a smaller alignment deviation. Therefore, the array substrate of the present disclosure can increase the aperture ratio of the pixel region to a certain extent.

In addition, in the present disclosure, the first portion 301 of the data line 3 is located in the preset subregion Z100, which means that the first portion 301 and the reflective electrode 4 are not overlapped in a direction perpendicular to the first substrate 1, so that a coupling capacitance between the data line 3 and the reflective electrode 4 can be effectively reduced, and crosstalk of a continuously changing voltage signal in the data line 3 to a signal loaded on the reflective electrode 4 can be effectively reduced, thereby ensuring stable display of the subpixel region. It should be noted that although the first light shielding pattern 6 of the present disclosure completely covering the preset subregion Z100 will inevitable cause the first light shielding pattern 6 to be overlapped with the reflective electrode 4 in the direction perpendicular to the first substrate 1, since the first light shielding pattern 6 is far away from the reflective electrode 4 in the direction perpendicular to the first substrate 1, and a relatively small coupling capacitance is present between the first light shielding pattern 6 and the reflective electrode 4, the first light shielding pattern 6 generates substantially no crosstalk to the signal on the reflective electrode. In addition, the first light shielding pattern 6 may be designed to be in a floating state, that is, the first light shielding pattern 6 is not connected to any other conductive structure or loaded with any signal, so that an influence of the first light shielding pattern 6 on the signal loaded on the reflective electrode 4 can be eliminated.

In some embodiments, the first spacing region Z1 further includes a further subregion other than the preset subregion Z100, and each data line 3 further includes a further portion other than the first portion 301; and an overall orthographic projection of the first light shielding pattern 6 and the data line 3 on the first substrate 1 completely covers an orthographic projection of the first spacing region Z1 on the first substrate 1. In this embodiment, through cooperation of the first light shielding pattern 6 and the data line 3, the first spacing region Z1 formed between two adjacent reflective electrodes 4 in the first direction X is completely covered, and in this case, a black matrix pattern for light shielding on the opposite substrate at a position opposite to the first spacing region Z1 is omitted, thereby effectively improving the problem in the existing art with a relatively low aperture ratio of the pixel region due to provision of a black matrix pattern having a relatively large line width at a position on the opposite substrate opposite to the first spacing region Z1.

In some embodiments, the further portion of the data line 3 includes a second portion 302 intersected with a corresponding gate line 2, a third portion 303 connected between a first end of the second portion 302 and a second end of the first portion 301, and a fourth portion 304 connected between a second end of the second portion 302 and a first end of the first portion 301. The first portion 301 has a width w1 in the first direction X, and the third portion 303 has a width w3 in the first direction X, where w3>w1.

The further subregion of the first spacing region Z1 includes a second subregion Z102 arranged along the second direction Y with the preset subregion Z100, and an orthographic projection of the third portion 303 on the first substrate 1 completely covers an orthographic projection of the second subregion Z102 on the first substrate 1.

In the embodiment of the present disclosure, since the first light shielding pattern 6 is disposed opposite to the first portion 301, and a width w0 of the first light shielding pattern 6 in the first direction X is greater than the width w1 of the first portion 301 in the first direction X, the first spacing region Z1 (including the first subregion Z101 and the second subregion Z102, where the first subregion Z101 includes the preset subregion Z100) is actually covered by the first light shielding pattern 6 and the third portion 303 of the data line 3, and in this case, the width w1 of the first portion 301 of the data line 3 in the first direction X has no substantially effect on the shielding effect. Therefore, the width w1 of the first portion 301 in the first direction X can be designed to be relatively small while ensuring that an overall resistance of the data line 3 satisfies the signal transmission requirement. For example, the width w1 of the first portion 301 in the first direction X is smaller than a width s0 of the first spacing region Z1 in the first direction X, so as to prevent size reduction of other electrical structures (e.g., the second conductive plate of the storage capacitor described later) in the pixel region caused by the first portion 301 intruding into the pixel region, and to reduce the coupling capacitance between the first portion 301 and the reflective electrode 4. Meanwhile, the width w3 the third portion 303 of the data line 3 in the first direction X may be designed to be relatively large, and specifically, the width w3 of the third portion 303 in the first direction X is greater than the width s0 of the first spacing region Z1 in the first direction X.

In some embodiments, the second portion 302 has a width w2 in the first direction X, where w2<w3. Since the second portion 302 is intersected with the gate line 2, to minimize a coupling capacitance between the data line 3 and the gate line 2, the width w1 of the second portion 302 in the first direction X can be designed to be relatively small while ensuring that the overall resistance of the data line 3 meets the signal transmission requirement.

In some embodiments, the fourth portion 304 has a minimum width w4 in the first direction X, where w4>w1. Considering that the fourth portion 304 is located near an intersection of the gate line 2 and the data line 3, this region generally serves as a spacer placement region (i.e., a region for placing a spacer), which is desired to be shielded by a black matrix to prevent light transmission. Without substantially affecting the aperture ratio of the pixel region, a size of the fourth portion 304 can be increased, so that the overall resistance of the data line 3 can be reduced on the one hand, and, on the other hand, the spacer placement region can be covered to a certain extent when there is a relatively large alignment deviation between the black matrix and the spacer placement region, thereby reducing a light transmission risk of the spacer placement region.

In some embodiments, an end of the fourth portion 304 connected to the second end of the second portion 302 is a first end of the fourth portion 304, and an end of the fourth portion 304 connected to the first end of the first portion 301 is a second end of the fourth portion 304; and in a direction from the first end of the fourth portion 304 to the second end of the fourth portion 304, the fourth portion 304 has a width in the first direction X monotonically decreasing. With such a design, an influence of the fourth portion 304 on the aperture ratio of the pixel region can be reduced while the fourth portion 304 can cover the spacer placement region to a certain extent.

In some embodiments, the array substrate further includes a plurality of common voltage lines 16 disposed in the same layer as the gate lines 2, extending in the first direction X, and insulated from the first light shielding pattern 6. For any subpixel region, a gate line 2 corresponding to the subpixel region is located on a second side of a common voltage line 16 corresponding to the subpixel region. The first spacing region Z1 is divided into a first subregion Z101 and a second subregion 102 by the corresponding common voltage line 16, the first subregion Z101 is located on a first side of the corresponding common voltage line 16, the second subregion Z102 is located on a second side of the corresponding common voltage line 16, and the first side and the second side are opposite sides in the second direction Y. The preset subregion Z100 is located in the first subregion Z101, an end of the first portion 301 away from the second subregion is the first end of the first portion 301, and an end of the first portion 301 close to the second subregion Z102 is the second end of the first portion 301.

Since the common voltage line 16 is insulated from the first light shielding pattern 6, a region not covered by the first light shielding pattern 6 is inevitably included in the first subregion Z101. Therefore, the third portion 303 of the data line 3 can be used to not only completely cover the second subregion Z102, but also cover the region of the first subregion Z101 not covered by the first light shielding pattern 6, thereby completely covering the first subregion Z101 and the second subregion Z102 with the first light shielding pattern 6 and the third portion 303 of the data line 3.

In some embodiments, the reflective region is further provided with a transistor and a storage capacitor. A gate 10 of the transistor is electrically connected to a corresponding gate line 2, a first electrode 12a of the transistor is electrically connected to the reflective electrode 4, and a second electrode 12b of the transistor is electrically connected to a corresponding data line 3. The storage capacitor includes a first conductive plate and a second conductive plate disposed opposite to each other. The first conductive plate is disposed in the same layer as the gate lines 2 and connected to a corresponding common voltage line 16, while the second conductive plate is disposed in the same layer as the data lines 3 and connected to the first electrode 12a of the transistor. The reflective electrode 4 is located on a side of the second conductive plate away from the first substrate 1, and connected to the second conductive plate through a via.

One of the first electrode 12a and the second electrode 12b of the transistor is a source of the transistor, and the other is a drain of the transistor. The transistor further includes an active layer 13 electrically connected to both the first electrode 12a and the second electrode 12b, and a gate insulating layer 9 is further provided between the gate 10 and the active layer 13.

Figure 13:
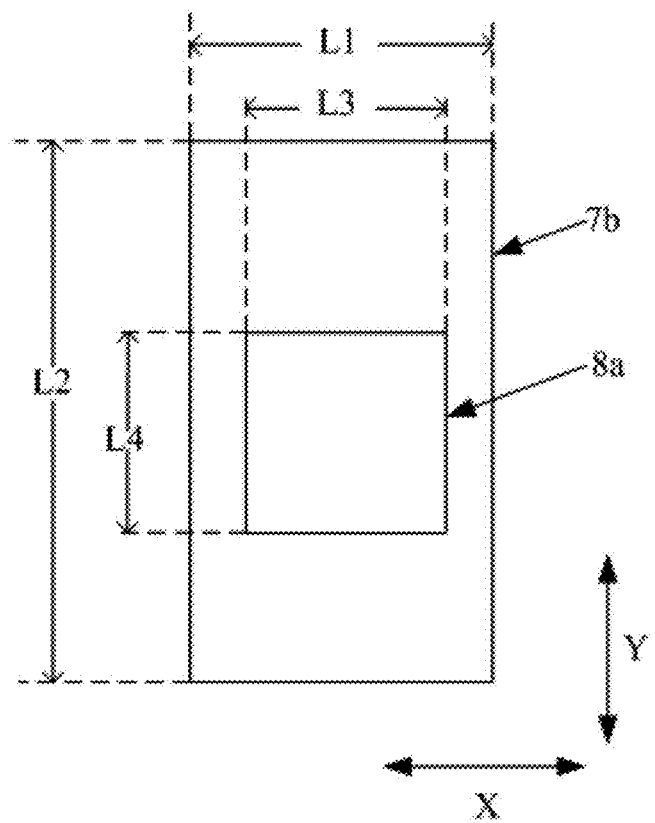
FIG. 13 is a schematic top view of a first via in a planarization layer and a second via in a passivation layer according to an embodiment of the present disclosure.

FIG. 13 is a schematic top view of a first via in a planarization layer and a second via in a passivation layer according to an embodiment of the present disclosure. As shown in FIG. 13, in some embodiments, a planarization layer 7 formed with a first via 7b is provided on a side of the second conductive plate away from the first substrate 1, and a passivation layer 8 is provided on a side of the planarization layer 7 away from the first substrate 1 and formed with a second via 8a in a region where the first via 7b is located. The reflective electrode 4 is located on a side of the passivation layer 8 away from the first substrate 1, and connected to the second conductive plate through the second via 8a. A length of the first via 7b in the first direction X is smaller than a length of the first via 7b in the second direction Y.

In the existing art, the first via 7b in the planarization layer 7 is generally a via with a square cross section (parallel to the first substrate 1), and since the second via 8a is subsequently formed in the region where the first via 7b is located, to guarantee sufficiently packaging the second via 8a by the first via 7b even when an alignment deviation occurs, the first via 7b in the planarization layer 7 is generally enlarged in both row and column directions, for example, from 6 μm×6 μm to 10 μm×10 μm, to keep the square shape of the first via 7b. However, since portions of the reflective electrode 4 on a sidewall of the first via 7b and within the first via 7b cannot satisfy cell gap matching, these portions cannot be used for reflective display, i.e., cannot serve as a reflective region. As can be seen, a larger size of the first via 7b will lead to a smaller area of the reflective region in the pixel region.

Different from the existing art, in the design stage of the array substrate according to the present disclosure, the first via 7b in the planarization layer 7 is enlarged unidirectionally along the second direction Y, while the length of the first via 7b in the first direction X remains unchanged (resulting in a rectangular cross section of the first via 7b), so that while ensuring sufficiently packaging the second via 8a by the first via 7b under the condition of an alignment deviation, the size of the first via 7b is minimized to optimize the area of the reflective region. In some embodiments, the first via 7b has a length L1 in the first direction X, where 5.5 μm≤L1≤6.5 μm, and L1 may be, for example, 6 μm. The first via 7b has a length L2 in the second direction Y, where 9 μm≤L2≤11 μm, and L2 may be, for example, 10 μm. Exemplarily, a final size of the first via 7b is designed to be 6 μm×10 μm.

In some embodiments, a length L3 of the second via 8a in the first direction X is smaller than the length L1 of the first via 7b in the first direction X; and a length L4 of the second via 8a in the second direction Y is the same as the length L3 of the second via 8a in the first direction X. The length L4 being the same as the length L3 refers to the case where the length L4 is equal to or approximately equal to the length L3. In other words, the second via 8a has a square or approximately square cross section. In some embodiments, 4 μm≤L3≤5 μm, 4 μm≤L3≤5 μm, and both L3 and L4 may be, for example, 4.5.

In some embodiments, the first conductive plate includes a first conductive pattern 11 on a first side of a corresponding common voltage line 16, the second conductive plate includes a second conductive pattern 14 on the first side of a corresponding common voltage line 16, and the first conductive pattern 11 and the second conductive pattern 14 are disposed opposite to each other to constitute a part of the storage capacitor. Two adjacent first conductive patterns 11 in the first direction X have a gap s1 therebetween in the first direction X, two adjacent second conductive patterns 14 in the first direction X have a gap s2 therebetween in the first direction X, the first spacing region Z1 has a width s0 in the first direction X, and the first light shielding pattern 6 has a width w0 in the first direction X; where s0≤w0<s1, s0≤w1<s2, and s1>s2.

In the present disclosure, since the first light shielding pattern 6 is disposed in the same layer as the first conductive pattern 11 and located between two adjacent first conductive patterns 11 in the first direction X, the first portion 301 of the data line 3 is disposed in the same layer as the second conductive pattern 14 and located between two adjacent second conductive patterns 14 in the first direction X, and the width w0 of the first light shielding pattern 6 in the first direction X is greater than the width w1 of the first portion 301 of the data line 3 in the first direction X, the gap s1 in the first direction X of the two adjacent first conductive patterns 11 in the first direction X may be designed to be greater than the gap s2 in the first direction X of the two adjacent second conductive patterns 14 in the first direction X.

In some embodiments, the first spacing region Z1 has a width s0 in the first direction X, the first light shielding pattern 6 has a width w0 in the first direction X, and the first portion 301 has a width w1 in the first direction X; where 6 μm≤s0≤7 μm, 9 μm≤w0≤12 μm, and 2 μm≤w1≤4 μm.

As a specific optional implementation for the embodiment of the present disclosure, the width s0 of the first spacing region Z1 in the first direction X is designed to be 6 μm≤s0≤7 μm, and s0 may be, for example, 6.5 μm; the width w0 of the first light shielding pattern 6 in the first direction X is designed to be 9 μm≤w0≤12 μm, and w0 may be, for example, 10 μm; the width w1 of the first portion 301 of the data line 3 in the first direction X is designed to be 2 µm≤w1≤4 µm, and w1 may be, for example, 3 µm; the width w2 of the second portion 302 of the data line 3 in the first direction X is designed to be 2 µm≤w2≤4 µm, and w2 may be, for example, 3 µm; the width w3 of the third portion 303 of the data line 3 in the first direction X is designed to be 9 µm≤w3≤12 µm, and w3 may be, for example, 11 µm; and the minimum width w4 of the fourth portion 304 in the first direction X is designed to be 9 µm≤w4≤12 µm, and w4 may be, for example, 11 µm.

In some embodiments, a second spacing region Z2 is formed between two adjacent reflective electrodes 4 in the second direction Y, and extends in the second direction Y. Each gate line 2 includes a fifth portion 201 and a sixth portion 202 alternately arranged, the fifth portion 201 is intersected with a corresponding data line 3, and the sixth portion 202 is connected to an adjacent fifth portion 201. An orthographic projection of the sixth portion 202 on the first substrate 1 completely covers an orthographic projection of the second spacing region Z2 on the first substrate 1.

In the embodiment of the present disclosure, by increasing a line width of the fifth portion 201 of the gate line 2 in the array substrate, the fifth portion 201 can shield the second spacing region Z2 formed between two adjacent reflective electrodes 4 in the second direction Y, and in this case, a black matrix pattern for light shielding on the opposite substrate at a position opposite to the second spacing region Z2 is omitted, thereby effectively improving the problem in the existing art with a relatively low aperture ratio of the pixel region due to provision of a black matrix pattern having a relatively large line width at a position on the opposite substrate opposite to the second spacing region Z2. As can be seen, the aperture ratio of the pixel region can be further improved by shielding the second spacing region Z2 with the fifth portion 201 of the gate line 2.

In some embodiments, the fifth portion 201 of the gate line 2 has a width w5 in the second direction Y, and the sixth portion 202 of the gate line 2 has a width w6 in the second direction Y; where w5<w6. Since the fifth portion 201 is intersected with a corresponding data line 3, and to minimize a coupling capacitance between the gate line 2 and the data line 3, the width w5 of the fifth portion 201 in the first direction X can be designed to be relatively small while ensuring that the overall resistance of the gate line 2 meets the signal transmission requirement.

In some embodiments, a width s3 of the second spacing region Z2 in the second direction Y is designed to be 6 µm≤s3≤7 µm, and s3 may be, for example, 6.5 µm; the width w5 of the fifth portion 201 in the second direction Y is designed to be 4 µm≤w5≤6 µm, and w5 may be, for example, 5 µm; and the width w6 of the sixth portion 202 in the second direction Y is designed to be 9 µm≤w6≤12 µm, and w6 may be, for example, 10 µm.

In some embodiments, the reflective region is further provided with a transistor. A gate 10 of the transistor is connected to a corresponding gate line 2, a first electrode 12a of the transistor is connected to the reflective electrode 4, and a second electrode 12b of the transistor is connected to a corresponding data line 3. A planarization layer 7 formed with a transmissive 7a is provided on a side of the transistor away from the first substrate 1, and a passivation layer 8 is provided on a side of the planarization layer 7 away from the first substrate 1. The reflective electrode 4 is located on a side of the passivation layer 8 away from the first substrate 1, and formed with a third via 4a in a region where the transmissive 7a is located. The transmissive electrode 5 is located on a side of the reflective electrode 4 away from the first substrate 1 and completely covers the third via 4a. A region where the third via 4a is located is the transmissive region.

It should be noted that, in some embodiments, a buffer layer (which may be made of silicon oxide and/or silicon nitride) may be further provided between the transistor and the planarization layer 7, to effectively increase the bonding strength between the planarization layer 7 and an underlying film layer.

Figure 14:
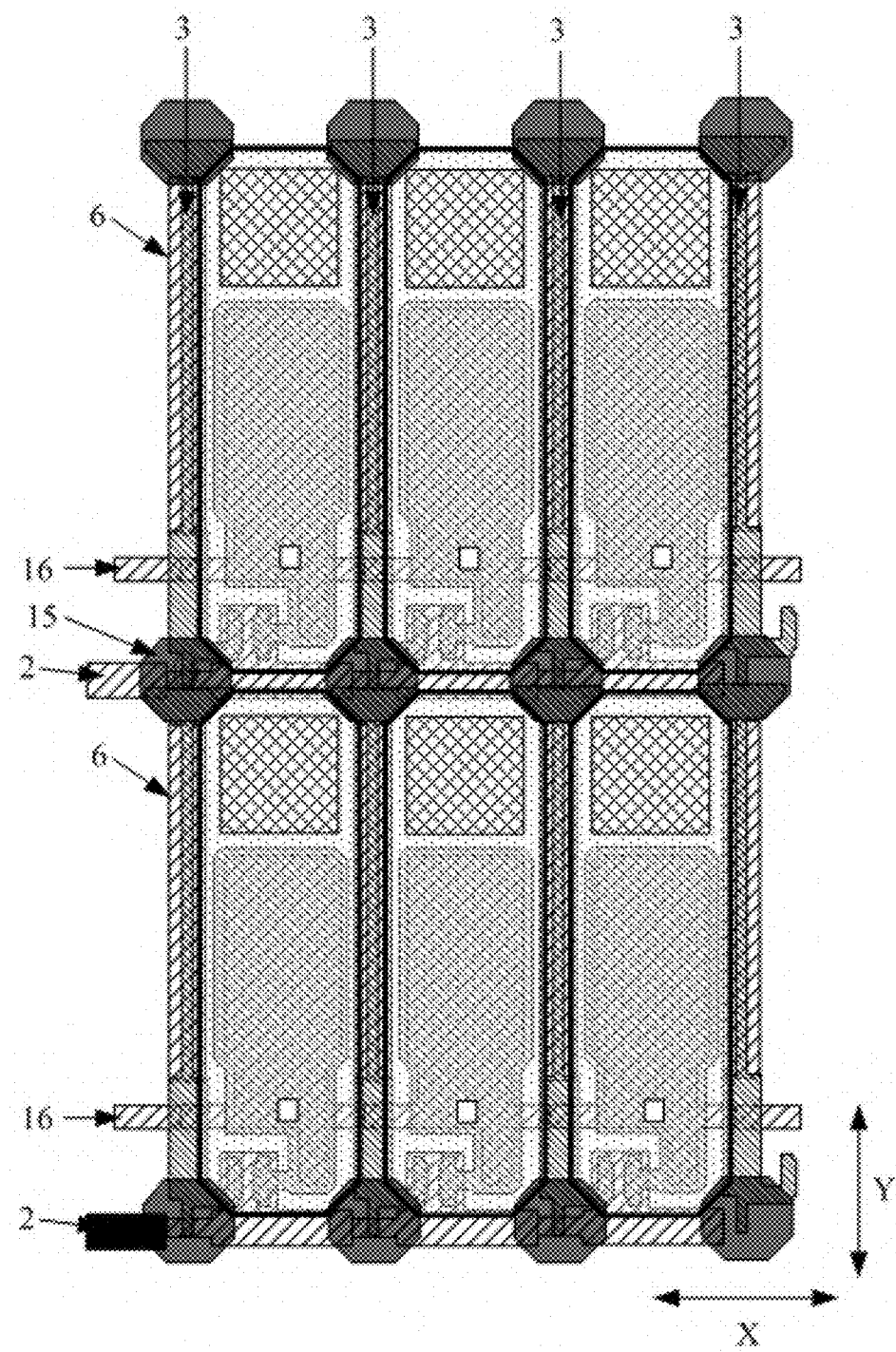
FIG. 14 is a schematic top view of a part of a display panel according to an embodiment of the present disclosure.
Figure 15:
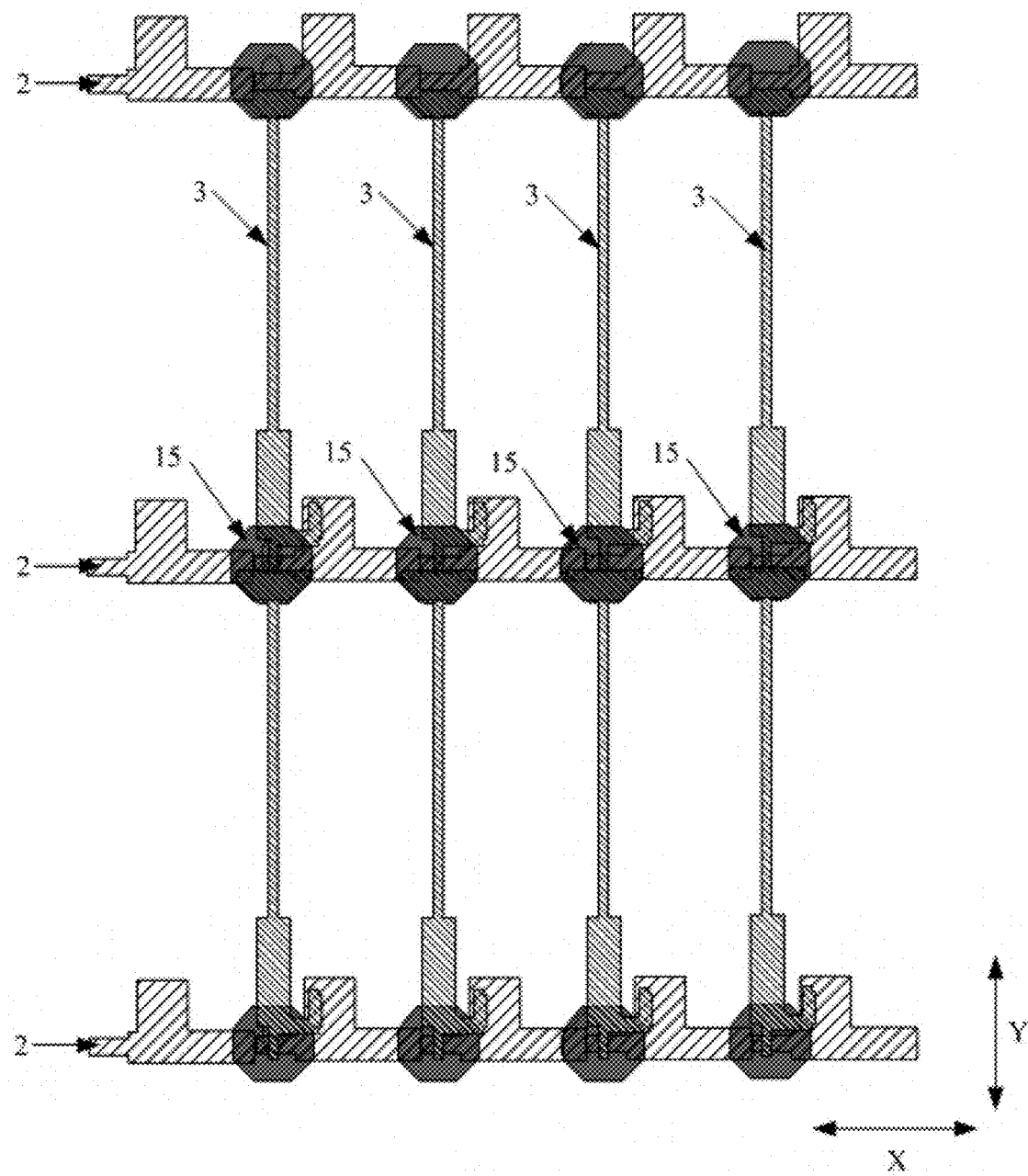
FIG. 15 is a schematic view showing distribution of second light shielding patterns on an opposite substrate according to an embodiment of the present disclosure.

Based on the same inventive concept, an embodiment of the present disclosure further provides a display panel. FIG. 14 is a schematic top view of a part of a display panel according to an embodiment of the present disclosure, and FIG. 15 is a schematic view showing distribution of second light shielding patterns on an opposite substrate according to an embodiment of the present disclosure. As shown in FIG. 14 and FIG. 15, the display panel includes an array substrate, which is the array substrate according to any embodiment described above. For the description of the array substrate, reference may be made to the contents in the foregoing embodiments, and details are not repeated here.

In the embodiment of the present disclosure, by providing the first light shielding pattern on the array substrate, the first light shielding pattern can shield the preset subregion in the first spacing region formed between two adjacent reflective electrodes in the first direction, and in this case, a black matrix pattern for light shielding on the opposite substrate at a position opposite to the preset subregion is omitted, thereby effectively improving the problem in the existing art with a relatively low aperture ratio of the pixel region due to provision of a black matrix pattern having a relatively large line width at a position on the opposite substrate opposite to the preset subregion. As can be seen, the array substrate of the present disclosure can increase the aperture ratio of the pixel region to a certain extent.

The display panel provided in the embodiment of the present disclosure is a transflective liquid crystal display panel, and further includes an opposite substrate disposed opposite to the array substrate, and a liquid crystal layer between the array substrate and the opposite substrate. Optionally, a liquid crystal cell gap at the reflective region is half a liquid crystal cell gap at the transmissive region.

In some embodiments, a plurality of spacers are provided between the array substrate and the opposite substrate; the opposite substrate includes a second substrate, and a second light shielding pattern 15 on a side of the second substrate close to the array substrate; and an orthographic projection of the second light shielding pattern 15 on the second substrate completely covers an orthographic projection of the spacers on the second substrate, but is not overlapped with the orthographic projection of the first spacing region Z1 on the second substrate. In other words, no light shielding material is provided on the opposite substrate at a position opposite to the first spacing region Z1, thereby effectively improving the problem in the existing art with a relatively low aperture ratio of the pixel region due to provision of a black matrix pattern having a relatively large line width at a position on the opposite substrate opposite to the first spacing region Z1. Therefore, this design can increase the aperture ratio of the pixel region to a certain extent.

The second light shielding pattern 15 may be made of the same material as a conventional black matrix, which may specifically include a resin material.

The orthographic projection of the second light shielding pattern 15 on the second substrate is not overlapped with the orthographic projection of the second spacing region Z2 on the second substrate. In other words, no light shielding material is provided on the opposite substrate at a position opposite to the second spacing region Z2, thereby effectively improving the problem in the existing art with a relatively low aperture ratio of the pixel region due to provision of a black matrix pattern having a relatively large line width at a position on the opposite substrate opposite to the second spacing region Z2. Therefore, this design can further increase the aperture ratio of the pixel region to a certain extent.

In some embodiments, a spacer placement region is provided at each intersection of the gate lines 2 and the data lines 3, and the spacers and the second light shielding pattern 15 are both located in the spacer placement region. In other words, the second light shielding pattern 15 covers only a certain range at the intersection of the gate line 2 and the data line 3.

Further optionally, the second light shielding pattern 15 has a regular octagonal shape. With such a design, the influence of the second light shielding pattern 15 on the aperture ratio of the pixel region can be reduced while the second light shielding pattern 15 covers the spacer placement region to a certain extent.

Based on the same inventive concept, an embodiment of the present disclosure further provides a display apparatus, including a display panel being the display panel according to any embodiment described above. For the description of the display panel, reference may be made to the contents in the foregoing embodiments, and details are not repeated here.

The display apparatus provided in the embodiment of the present disclosure may be a mobile phone, a tablet, a television, a monitor, a laptop, a digital album, a navigator, an electronic display cabinet, or any other product or component having a display function.

Figure 16:
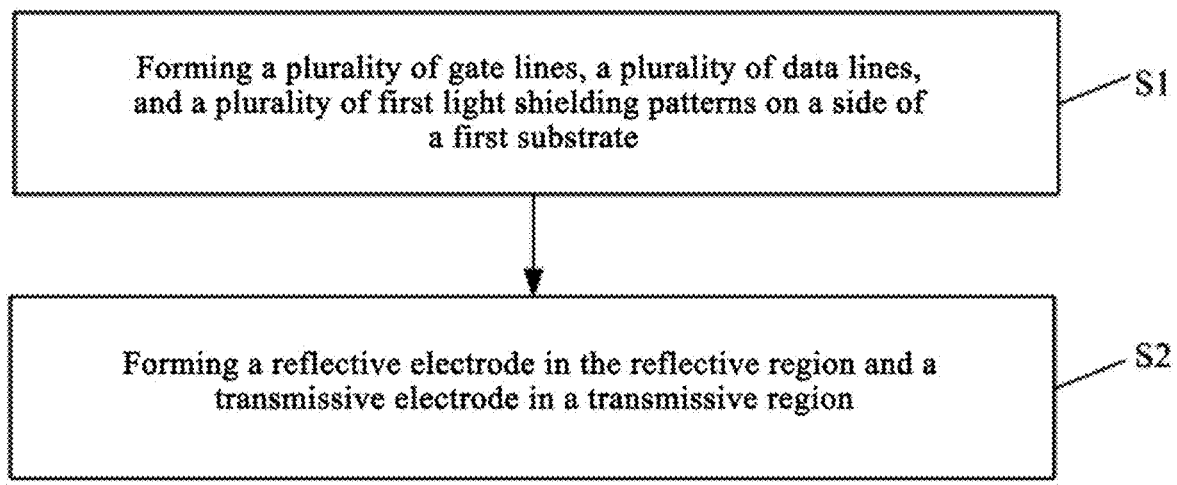
FIG. 16 is a flowchart of a method for preparing an array substrate according to an embodiment of the present disclosure.

Based on the same inventive concept, an embodiment of the present disclosure further provides a method for preparing an array substrate, which may be applied to prepare the array substrate according to any embodiment described above. FIG. 16 is a flowchart of a method for preparing an array substrate according to an embodiment of the present disclosure. As shown in FIG. 16, the method includes the following steps S1 and S2.

At step S1, forming a plurality of gate lines, a plurality of data lines, and a plurality of first light shielding patterns on a side of a first substrate.

The gate lines extend in a first direction, the data lines extend in a second direction, and the plurality of gate lines and the plurality of data lines define a plurality of subpixel regions each including a reflective region and a transmissive region. Each data line includes a first portion. The first light shielding patterns are disposed in the same layer as the gate lines and opposite to the first portion. A width of each first light shielding pattern in the first direction is greater than a width of the first portion in the first direction, and a length of each first light shielding pattern in the second direction is greater than or equal to a length of the first portion in the second direction.

In some embodiments, the first light shielding patterns and the gate lines are formed based on a patterning process of the same material film. In other words, the first light shielding patterns are simultaneously prepared based on the existing process for preparing the gate lines, and thus, no additional process for preparing the first light shielding patterns is needed.

It should be noted that the step S1 may be implemented based on a conventional array process, the specific flow of which is conventional in the art and will not be described in detail here.

At step S2, forming a reflective electrode in the reflective region and a transmissive electrode in a transmissive region.

The reflective electrode is electrically connected to the transmissive electrode, and a first spacing region is formed between two adjacent reflective electrodes in the first direction. The first spacing region extends in the second direction and includes a preset subregion having opposite edges in the first direction respectively coinciding with corresponding edges of two reflective electrodes adjacent to the preset subregion.

The first portion is located in the preset subregion, and a width of the first portion in the first direction is smaller than a width of the preset subregion in the first direction. An orthographic projection of the first light shielding pattern on the first substrate completely covers an orthographic projection of the preset subregion on the first substrate.

In the embodiment of the present disclosure, by providing the first light shielding pattern on the array substrate, the first light shielding pattern can shield the preset subregion in the first spacing region formed between two adjacent reflective electrodes in the first direction, and in this case, a black matrix pattern for light shielding on the opposite substrate at a position opposite to the preset subregion is omitted, thereby effectively improving the problem in the existing art with a relatively low aperture ratio of the pixel region due to provision a black matrix pattern having a relatively large line width at a position on the opposite substrate opposite to the preset subregion. As can be seen, the array substrate of the present disclosure can increase the aperture ratio of the pixel region to a certain extent.

The conventional steps for forming a reflective electrode generally include: first, forming a reflective metal material film; then, coating a photoresist over the reflective metal material film, exposing and developing the photoresist, reserving a portion of the photoresist in a region where a reflective electrode is to be formed, and removing other portions of the photoresist beyond the region where the reflective electrode is to be formed, to form an exposed region; and then, performing wet etching on the portion of the reflective metal material film in the exposed region for one time, to obtain a pattern of the reflective electrode. However, it is found in practical applications that an organic photoresist material is likely to be mixed with the underlying reflective metal material and thus is difficult to dissolve by a developing solution, and organic residues (a mixture of the photoresist and the reflective metal material) may remain in the exposed region after the development process. In the wet etching on the portion of the reflective metal material film in the exposed region, the presence of the organic residues may result in reflective metal material not etched in the exposed region under the organic residues. In other words, there is residual reflective metal material in the exposed region which may cause a defect (e.g., short circuit). To solve the above problem, in the existing art, "over-etching" is adopted in the wet etching process, i.e., the etching time is increased, so that the reflective metal material in the exposed region under the organic residues can be laterally etched away by the etching solution. However, although the over-etching can etch the reflective metal material in the exposed region under the organic residues, it may also laterally etch the reflective metal material around the exposed region, resulting in a larger gap (typically over 7.5 μm) between the connected reflective electrodes; and accordingly, the size of the reflective electrode, as well as the area of the reflective region, are reduced, which is not favorable for increasing the aperture ratio of the pixel.

To solve the above problem in the existing art, the process of forming the reflective electrode in step S2 in the present disclosure is improved; which specifically includes: first, forming a reflective metal material film, such as a silver material film; then, coating a photoresist on a side of the reflective metal material film away from the substrate, exposing the photoresist through a preset mask, developing the exposed photoresist, reserving a portion of the photoresist in a region where a reflective electrode is to be formed, and removing other portions of the photoresist beyond the region where the reflective electrode is to be formed, to form an exposed region; then, performing first wet etching on a reflective metal material in the exposed region; then, performing dry etching on organic residues in the exposed region; and performing second wet etching on the residual reflective metal material in the exposed region.

In other words, after the photoresist is completely exposed and developed, a first wet etching, a dry etching, and a second wet etching are sequentially performed on the exposed region. It should be noted that in the embodiment of the present disclosure, a total duration of the first wet etching and the second wet etching is far less than the duration of the wet over-etching in the existing art. Therefore, with the same size of exposed region on the photoresist, a gap between adjacent reflective electrodes (where a deviation between the adjacent reflective electrodes may be about 1.25 μm, and a gap between adjacent reflective electrodes may be about 6.5 μm) prepared by the present disclosure is smaller than the gap between adjacent reflective electrodes prepared by the wet over-etching process in the existing art.

As the gap between adjacent reflective electrodes decreases, the size of the prepared reflective electrode, as well as the area of the reflective region, are correspondingly increased, which is beneficial for increasing the aperture ratio of the pixel.

In some embodiments, after forming the data lines and before forming the reflective electrode, the method further includes a step of sequentially forming a planarization layer and a passivation layer; where a transmissive is formed in the planarization layer; and performing, in the process of preparing the reflective electrode, alignment with reference to an actual position of the prepared planarization layer.

When various structural layers of the array substrate are prepared in the existing art, alignment is generally performed with a first structural layer (i.e., the structural layer where the gate lines are located) on the first substrate as a reference, which may cause an increasing alignment deviation as the process goes on. Specifically, there is a relatively large alignment deviation between the third via in the reflective electrode and the transmissive hole in the planarization layer. In other words, it is hard to form the third via precisely in the region where the transmissive hole is located.

To solve the above technical problem, in the embodiments of the present disclosure, alignment is performed with reference to an actual position of the prepared planarization layer in the process of preparing the reflective electrode, so that the alignment deviation between the third via in the reflective electrode and the transmissive hole in the planarization layer can be effectively reduced, and thus the third via can be formed precisely in the region where the transmissive hole is located.

It will be appreciated that the above implementations are merely exemplary implementations for the purpose of illustrating the principle of the present disclosure, and the present disclosure is not limited thereto. It will be apparent to those skilled in the art that various modifications and variations may be made without departing from the spirit or essence of the present disclosure. Such modifications and variations should also be considered as falling into the protection scope of the present disclosure.

What is claimed is:

1. A display panel, comprising an array substrate, an opposite substrate opposite to the array substrate, and a liquid crystal layer between the array substrate and the opposite substrate,
    wherein the array substrate comprises a first substrate, a plurality of gate lines, and a plurality of data lines, wherein each of the plurality of gate lines extends in a first direction, each of the plurality of data lines extends in a second direction, and the plurality of gate lines and the plurality of data lines define a plurality of subpixel regions each comprising a reflective region and a transmissive region, the reflective region is provided with a reflective electrode, the transmissive region is provided with a transmissive electrode, and the reflective electrode is electrically connected to the transmissive electrode;
    a first spacing region is between any two adjacent reflective electrodes in the first direction, wherein the first spacing region extends in the second direction and comprises a preset subregion having opposite edges in the first direction respectively coinciding with corresponding edges of the two reflective electrodes adjacent to the preset subregion;
    the data line comprises a first portion in the preset subregion, and a width of the first portion in the first direction is smaller than a width of the preset subregion in the first direction; and
    the array substrate further comprises a first light shielding pattern opposite to the first portion and in the same layer as the gate lines, wherein an orthographic projection of the first light shielding pattern on the first substrate completely covers an orthographic projection of the preset subregion on the first substrate,
    wherein a plurality of spacers are provided between the array substrate and the opposite substrate;
    the opposite substrate comprises a second substrate, and second light shielding patterns on a side of the second substrate close to the array substrate; and
    an orthographic projection of each of the second light shielding patterns on the second substrate completely covers an orthographic projection of one of the spacers on the second substrate, but is not overlapped with the orthographic projection of the first spacing region on the second substrate.

2. The display panel according to claim 1, wherein a second spacing region is between two adjacent reflective electrodes in the second direction, and extends in the second direction;
    the gate line comprises a fifth portion and a sixth portion alternately arranged, the fifth portion is intersected with a corresponding one of the plurality of data lines, and the sixth portion is connected to an adjacent fifth portion;
    an orthographic projection of the sixth portion on the first substrate completely covers an orthographic projection of the second spacing region on the first substrate; and
    the orthographic projection of the second light shielding pattern on the second substrate is not overlapped with the orthographic projection of the second spacing region on the second substrate, and/or wherein a spacer placement region is provided at each one of intersections of the plurality of gate lines and the plurality of data lines, and the spacers and the second light shielding patterns are each in the spacer placement region, and/or wherein the second light shielding pattern has a regular octagonal shape.

3. A display apparatus, comprising the display panel according to claim 1.

4. The display panel according to claim 1, wherein the first spacing region further comprises a further subregion other than the preset subregion, and the data line further comprises a further portion other than the first portion; and
an overall orthographic projection of the first light shielding pattern and the data line on the first substrate completely covers an orthographic projection of the first spacing region on the first substrate.

5. The display panel according to claim 4, wherein the further portion comprises a second portion intersected with a corresponding one of the plurality of gate lines, a third portion connected between a first end of the second portion and a second end of the first portion, and a fourth portion connected between a second end of the second portion and a first end of the first portion; and
the first portion has a width w1 in the first direction, and the third portion has a width w3 in the first direction; where w3>w1.

6. The display panel according to claim 5, wherein the further subregion comprises a second subregion arranged along the second direction with the preset subregion, and an orthographic projection of the third portion on the first substrate completely covers an orthographic projection of the second subregion on the first substrate, and/or
wherein the second portion has a width w2 in the first direction;
where w2<w3, and/or
wherein the fourth portion has a minimum width w4 in the first direction;
where w4>w1,
an end of the fourth portion connected to the second end of the second portion is a first end of the fourth portion, and an end of the fourth portion connected to the first end of the first portion is a second end of the fourth portion; and
in a direction from the first end of the fourth portion to the second end of the fourth portion, the fourth portion has a width in the first direction monotonically decreasing.

7. The display panel according to claim 5, wherein the array substrate further comprises a plurality of common voltage lines in the same layer as the gate lines, extending in the first direction, and insulated from the first light shielding pattern; wherein
for any one of the plurality of subpixel regions, a gate line corresponding to the subpixel region is located on a second side of a common voltage line corresponding to the subpixel region;
the first spacing region is divided into a first subregion and a second subregion by the corresponding common voltage line, the first subregion is on a first side of the corresponding common voltage line, the second subregion is on a second side of the corresponding common voltage line, and the first side and the second side are opposite sides in the second direction; and
the preset subregion is in the first subregion, an end of the first portion away from the second subregion is the first end of the first portion, and an end of the first portion close to the second subregion is the second end of the first portion.

8. The display panel according to claim 7, wherein the reflective region is further provided with a transistor and a storage capacitor,
a gate of the transistor is electrically connected to a corresponding one of the plurality of gate lines, a first electrode of the transistor is electrically connected to the reflective electrode, and a second electrode of the transistor is electrically connected to a corresponding one of the plurality of data lines;
the storage capacitor comprises a first conductive plate and a second conductive plate opposite to each other, the first conductive plate is in the same layer as the gate lines and connected to a corresponding one of the plurality of common voltage lines, while the second conductive plate is in the same layer as the data lines and connected to the first electrode of the transistor; and
the reflective electrode is on a side of the second conductive plate away from the first substrate, and connected to the second conductive plate through a via.

9. The display panel according to claim 8, wherein a planarization layer formed with a first via is provided on a side of the second conductive plate away from the first substrate, and a passivation layer is provided on a side of the planarization layer away from the first substrate and formed with a second via in a region where the first via is located;
the reflective electrode is on a side of the passivation layer away from the first substrate, and connected to the second conductive plate through the second via; and
a length of the first via in the first direction is smaller than a length of the first via in the second direction.

10. The display panel according to claim 9, wherein the first via has a length L1 in the first direction, and the first via has a length L2 in the second direction;
where $5.5\mu m \leq L1 \leq 6.5\mu m$; and
$9\mu m \leq L2 \leq 11\mu m$ and/or
wherein a length of the second via in the first direction is smaller than a length of the first via in the first direction; and
a length of the second via in the second direction is the same as the length of the second via in the first direction.

11. The display panel according to claim 9, wherein the first via has a length L1 in the first direction, the first via has a length L2 in the second direction, the second via has a length L3 in the first direction, and the second via has a length L4 in the second direction;
where $5.5\mu m \leq L1 \leq 6.5\mu m$;
$9\mu m \leq L2 \leq 11\mu m$;
$4\mu m \leq L3 \leq \mu m$; and
$4\mu m \leq L4 \leq 5\mu m$.

12. The display panel according to claim 8, wherein the first conductive plate comprises a first conductive pattern on a first side of the corresponding common voltage line, and the second conductive plate comprises a second conductive pattern on the first side of the corresponding common voltage line;
two adjacent first conductive patterns in the first direction have a gap s1 therebetween in the first direction, two adjacent second conductive patterns in the first direction have a gap s2 therebetween in the first direction, the first spacing region has a width s0 in the first direction, and the first light shielding pattern has a width w0 in the first direction;

where $s0 \leq w0 < s1$, $s0 \leq w1 < s2$, and $s1 > s2$.

13. The display panel according to claim 1, wherein the first spacing region has a width s0 in the first direction, the first light shielding pattern has a width w0 in the first direction, and the first portion has a width w1 in the first direction;
where $6\mu m \leq s0 \leq 7\mu m$;
$9\mu m \leq w0 \leq 12\mu m$; and
$2\mu m \leq w1 \leq 4\mu m$.

14. The display panel according to claim 5, wherein the first spacing region has a width s0 in the first direction, the first light shielding pattern has a width w0 in the first direction, the second portion has a width w2 in the first direction, and the fourth portion has a minimum width w4 in the first direction;
where $6\mu m \leq s0 \leq 7\mu m$;
$9\mu m \leq w0 \leq 12\mu m$;
$2\mu m \leq w1 \leq 4\mu m$;
$2\mu m \leq w2 \leq 4\mu m$;
$9\mu m \leq w3 \leq 12\mu m$; and
$9\mu m \leq w4 \leq 12\mu m$.

15. The display panel according to claim 1, wherein a second spacing region is between two adjacent reflective electrodes in the second direction, and extends in the second direction;
the gate line comprises a fifth portion and a sixth portion alternately arranged, the fifth portion is intersected with a corresponding one of the plurality of data lines, and the sixth portion is connected to an adjacent fifth portion; and
an orthographic projection of the sixth portion on the first substrate completely covers an orthographic projection of the second spacing region on the first substrate.

16. The display panel according to claim 15, wherein the fifth portion has a width w5 in the second direction, and the sixth portion has a width w6 in the second direction;
where $w5 < w6$, and/or
wherein the second spacing region has a width s3 in the second direction, the fifth portion has a width w5 in the second direction, and the sixth portion has a width w6 in the second direction;
where $6\mu m \leq s3 \leq 7\mu m$;
$4\mu m \leq w5 \leq 6\mu m$; and
$9\mu m \leq w6 \leq 12\mu m$.

17. The display panel according to claim 1, wherein the reflective region is further provided with a transistor, wherein a gate of the transistor is connected to a corresponding one of the plurality of gate lines, a first electrode of the transistor is connected to the reflective electrode, and a second electrode of the transistor is connected to a corresponding one of the plurality of data lines;
a planarization layer formed with a transmissive is provided on a side of the transistor away from the first substrate, and a passivation layer is provided on a side of the planarization layer away from the first substrate; and
the reflective electrode is on a side of the passivation layer away from the first substrate, and formed with a third via in a region where the transmissive is located, the transmissive electrode is on a side of the reflective electrode away from the first substrate and completely covers the third via, and a region where the third via is the transmissive region.

* * * * *